United States Patent
Huang et al.

(10) Patent No.: US 11,658,229 B2
(45) Date of Patent: May 23, 2023

(54) SEMICONDUCTOR DEVICE AND METHOD FOR FABRICATING THE SAME

(71) Applicant: United Semiconductor (Xiamen) Co., Ltd., Fujian (CN)

(72) Inventors: Shih-Hsien Huang, Kaohsiung (TW); Sheng-Hsu Liu, Changhua County (TW); Wen Yi Tan, Fujian (CN)

(73) Assignee: United Semiconductor (Xiamen) Co., Ltd.

( * ) Notice: Subject to any disclaimer, the term of this patent is extended or adjusted under 35 U.S.C. 154(b) by 0 days.

(21) Appl. No.: 16/914,503

(22) Filed: Jun. 29, 2020

(65) Prior Publication Data

US 2021/0376125 A1 Dec. 2, 2021

(30) Foreign Application Priority Data

May 29, 2020 (CN) .......................... 202010472945.9

(51) Int. Cl.
*H01L 29/66* (2006.01)
*H01L 29/78* (2006.01)
*H01L 29/08* (2006.01)

(52) U.S. Cl.
CPC .... *H01L 29/66636* (2013.01); *H01L 29/0847* (2013.01); *H01L 29/6653* (2013.01); *H01L 29/6659* (2013.01); *H01L 29/7833* (2013.01)

(58) Field of Classification Search
CPC ......... H01L 29/66636; H01L 29/41783; H01L 29/66515; H01L 29/66575–66598; H01L 21/823814; H01L 29/0886; H01L 29/66628

See application file for complete search history.

(56) References Cited

U.S. PATENT DOCUMENTS

| | | | | |
|---|---|---|---|---|
| 4,116,720 | A * | 9/1978 | Vinson | H01L 27/10823 438/239 |
| 4,860,084 | A * | 8/1989 | Shibata | H01L 23/485 257/288 |
| 5,882,535 | A * | 3/1999 | Stocks | H01L 21/768 257/E21.252 |
| 6,372,564 | B1 * | 4/2002 | Lee | H01L 27/115 438/192 |
| 6,849,519 | B2 * | 2/2005 | Dong | H01L 21/76205 257/506 |
| 7,335,959 | B2 | 2/2008 | Curello et al. | |
| 7,557,396 | B2 * | 7/2009 | Ando | H01L 29/41775 257/288 |

(Continued)

FOREIGN PATENT DOCUMENTS

CN 107275210 A 10/2017

*Primary Examiner* — Maliheh Malek
(74) *Attorney, Agent, or Firm* — Winston Hsu

(57) ABSTRACT

A method for fabricating semiconductor device includes the steps of first forming a gate structure on a substrate, forming a spacer adjacent to the gate structure, forming a recess adjacent to the spacer, trimming part of the spacer, and then forming an epitaxial layer in the recess. Preferably, the semiconductor device includes a first protrusion adjacent to one side of the epitaxial layer and a second protrusion adjacent to another side of the epitaxial layer, the first protrusion includes a V-shape under the spacer and an angle included by the V-shape is greater than 30 degrees and less than 90 degrees.

4 Claims, 4 Drawing Sheets

(56) References Cited

U.S. PATENT DOCUMENTS

| | | | |
|---|---|---|---|
| 7,736,957 B2* | 6/2010 | Grudowski | H01L 29/7848 257/E21.63 |
| 8,269,255 B2* | 9/2012 | Shin | H01L 29/6659 257/190 |
| 8,377,784 B2* | 2/2013 | Cheng | H01L 29/7848 438/300 |
| 8,394,712 B2* | 3/2013 | Dube | H01L 21/823878 438/607 |
| 8,404,538 B2* | 3/2013 | Lai | H01L 29/7848 257/190 |
| 8,558,289 B2* | 10/2013 | Cheng | H01L 29/165 257/255 |
| 8,723,266 B2* | 5/2014 | Tsai | H01L 29/6659 257/368 |
| 8,883,651 B2* | 11/2014 | Kim | H01L 29/7835 438/303 |
| 8,906,789 B2* | 12/2014 | Tsai | C30B 25/165 438/482 |
| 9,105,654 B2* | 8/2015 | Ma | H01L 29/7816 |
| 9,214,552 B2* | 12/2015 | Huang | H01L 21/30604 |
| 9,419,089 B1* | 8/2016 | Lin | H01L 21/76 |
| 9,627,480 B2* | 4/2017 | Chou | H01L 21/30604 |
| 9,716,165 B1* | 7/2017 | Lin | H01L 21/2254 |
| 9,812,363 B1* | 11/2017 | Liao | H01L 29/0847 |
| 9,812,573 B1* | 11/2017 | Malinowski | H01L 27/088 |
| 9,935,102 B1* | 4/2018 | Bi | H01L 29/66666 |
| 9,985,131 B2* | 5/2018 | Ma | H01L 29/66795 |
| 9,997,417 B2* | 6/2018 | Liu | H01L 29/66636 |
| 10,505,001 B2* | 12/2019 | Chang | H01L 29/41791 |
| 10,546,922 B2* | 1/2020 | Hsu | H01L 23/485 |
| 10,573,737 B1* | 2/2020 | Liu | H01L 29/0847 |
| 10,644,158 B2* | 5/2020 | Jung | H01L 29/66545 |
| 10,811,516 B2* | 10/2020 | Young | H01L 29/4983 |
| 10,825,925 B2* | 11/2020 | Liu | H01L 29/7848 |
| 10,943,991 B2* | 3/2021 | Chuang | H01L 29/66636 |
| 2007/0012913 A1* | 1/2007 | Ohta | H01L 29/7848 257/E29.267 |
| 2007/0254414 A1* | 11/2007 | Miyanami | H01L 29/66636 438/149 |
| 2007/0262396 A1* | 11/2007 | Zhu | H01L 23/485 257/401 |
| 2008/0067557 A1 | 3/2008 | Yu | |
| 2008/0277699 A1* | 11/2008 | Chakravarthi | H01L 29/6659 257/E29.345 |
| 2009/0280579 A1* | 11/2009 | Pal | H01L 29/66636 257/E21.53 |
| 2009/0302348 A1* | 12/2009 | Adam | H01L 29/78 257/190 |
| 2010/0078689 A1* | 4/2010 | Kronholz | H01L 21/823814 257/E21.409 |
| 2011/0024801 A1* | 2/2011 | Cheng | H01L 29/6659 257/255 |
| 2011/0049567 A1* | 3/2011 | Peng | H01L 21/3065 257/190 |
| 2011/0220964 A1* | 9/2011 | Shin | H01L 29/66628 257/E29.005 |
| 2012/0058616 A1* | 3/2012 | Ahn | H01L 21/02532 438/285 |
| 2012/0164809 A1* | 6/2012 | Yoon | H01L 21/26506 438/303 |
| 2012/0261725 A1* | 10/2012 | Flachowsky | H01L 29/7848 257/E21.334 |
| 2012/0264267 A1* | 10/2012 | Lu | H01L 29/165 257/E21.409 |
| 2012/0299121 A1* | 11/2012 | Wu | H01L 29/66636 257/E21.409 |
| 2012/0319166 A1* | 12/2012 | Adam | H01L 29/7848 257/E21.409 |
| 2013/0045589 A1* | 2/2013 | Kim | H01L 21/26506 438/514 |
| 2013/0099314 A1* | 4/2013 | Lu | H01L 29/41783 257/347 |
| 2013/0109144 A1* | 5/2013 | Kim | H01L 21/02532 438/301 |
| 2013/0119444 A1* | 5/2013 | Cheng | H01L 21/30604 257/E21.409 |
| 2013/0207166 A1* | 8/2013 | Chen | H01L 21/02639 257/288 |
| 2014/0008736 A1* | 1/2014 | Li | H01L 29/7848 257/408 |
| 2014/0138745 A1* | 5/2014 | Shin | H01L 29/1095 257/192 |
| 2014/0141589 A1* | 5/2014 | Shin | H01L 29/66636 438/306 |
| 2014/0264558 A1* | 9/2014 | Chandra | H01L 29/045 257/329 |
| 2014/0264636 A1* | 9/2014 | Tsai | H01L 29/66628 438/300 |
| 2014/0329388 A1* | 11/2014 | Jang | H01L 21/28141 438/702 |
| 2014/0361339 A1* | 12/2014 | Liu | H01L 29/7834 257/192 |
| 2015/0021688 A1* | 1/2015 | Sung | H01L 21/02532 257/344 |
| 2015/0021696 A1* | 1/2015 | Sung | H01L 29/66492 257/368 |
| 2015/0132913 A1* | 5/2015 | Hong | H01L 29/165 438/285 |
| 2015/0179796 A1* | 6/2015 | Sung | H01L 29/045 257/288 |
| 2015/0206946 A1* | 7/2015 | Chen | H01L 29/66636 257/384 |
| 2015/0236157 A1* | 8/2015 | Kwok | H01L 21/02381 257/192 |
| 2015/0236158 A1* | 8/2015 | Chang | H01L 21/0245 257/190 |
| 2015/0255578 A1* | 9/2015 | Chang | H01L 29/7848 257/343 |
| 2015/0255601 A1* | 9/2015 | Huang | H01L 21/02433 257/408 |
| 2015/0295085 A1* | 10/2015 | Yu | H01L 29/6659 257/401 |
| 2015/0318212 A1* | 11/2015 | Tsai | H01L 21/823418 438/299 |
| 2015/0371892 A1* | 12/2015 | Xie | H01L 21/76224 438/424 |
| 2015/0372142 A1* | 12/2015 | Kuang | H01L 29/66636 257/192 |
| 2016/0056261 A1* | 2/2016 | Thees | H01L 29/0847 257/288 |
| 2016/0087104 A1* | 3/2016 | Lee | H01L 29/66545 257/192 |
| 2016/0163860 A1* | 6/2016 | Lee | H01L 29/66545 257/192 |
| 2016/0172495 A1* | 6/2016 | Zhu | H01L 21/823425 438/285 |
| 2016/0181383 A1* | 6/2016 | Huang | H01L 29/41791 257/757 |
| 2016/0190250 A1* | 6/2016 | Kwok | H01L 29/7848 257/77 |
| 2016/0197188 A1* | 7/2016 | Shin | H01L 29/66575 257/192 |
| 2016/0293702 A1* | 10/2016 | Chen | H01L 29/7834 |
| 2017/0054023 A1* | 2/2017 | Li | H01L 21/02236 |
| 2017/0098708 A1* | 4/2017 | Shen | H01L 29/7834 |
| 2017/0117410 A1* | 4/2017 | Hu | H01L 29/7848 |
| 2017/0133460 A1* | 5/2017 | Wu | H01L 29/6659 |
| 2017/0141229 A1* | 5/2017 | Liou | H01L 29/32 |
| 2017/0186855 A1* | 6/2017 | Murthy | H01L 29/165 |
| 2017/0278743 A1* | 9/2017 | Tsai | H01L 29/7848 |
| 2017/0338327 A1* | 11/2017 | Liu | H01L 29/6656 |
| 2018/0047810 A1* | 2/2018 | Hsu | H01L 29/7848 |
| 2018/0151730 A1* | 5/2018 | Ma | H01L 29/167 |
| 2018/0190788 A1* | 7/2018 | Kwok | H01L 29/66628 |
| 2018/0277534 A1* | 9/2018 | Huang | H01L 27/0886 |
| 2018/0286949 A1* | 10/2018 | Tsai | H01L 29/66636 |
| 2018/0337280 A1* | 11/2018 | Zhao | H01L 29/456 |
| 2019/0081176 A1* | 3/2019 | Hsia | H01L 29/0847 |

(56) References Cited

U.S. PATENT DOCUMENTS

| | | | |
|---|---|---|---|
| 2019/0123168 A1* | 4/2019 | Young | H01L 29/66636 |
| 2019/0164765 A1* | 5/2019 | Yeoh | H01L 21/76816 |
| 2019/0221570 A1* | 7/2019 | Liu | H01L 27/10805 |
| 2019/0341472 A1* | 11/2019 | Lee | H01L 29/0847 |
| 2019/0348296 A1* | 11/2019 | Sherpa | H01L 21/31116 |
| 2020/0020771 A1* | 1/2020 | Chen | H01L 21/0243 |
| 2020/0135922 A1* | 4/2020 | Chen | H01L 29/66795 |
| 2020/0243664 A1* | 7/2020 | Chuang | H01L 29/66545 |
| 2020/0295136 A1* | 9/2020 | Chen | H01L 21/02576 |
| 2020/0381537 A1* | 12/2020 | Lin | H01L 21/3065 |
| 2021/0057567 A1* | 2/2021 | Lee | H01L 29/0847 |
| 2021/0057570 A1* | 2/2021 | Lin | H01L 29/66636 |
| 2021/0098450 A1* | 4/2021 | Huang | H01L 21/30604 |
| 2021/0126108 A1* | 4/2021 | Chan | H01L 21/76804 |
| 2021/0151580 A1* | 5/2021 | Chuang | H01L 29/66628 |
| 2021/0175343 A1* | 6/2021 | Chen | H01L 29/66462 |
| 2021/0384197 A1* | 12/2021 | Jung | H01L 21/02181 |
| 2022/0028997 A1* | 1/2022 | Lu | H01L 29/6656 |
| 2022/0102493 A1* | 3/2022 | Park | H01L 27/088 |
| 2022/0102527 A1* | 3/2022 | Hsieh | H01L 29/6656 |
| 2022/0123256 A1* | 4/2022 | Hyun | H01L 51/525 |
| 2022/0190160 A1* | 6/2022 | Tang | H01L 29/66553 |
| 2022/0319934 A1* | 10/2022 | Liu | H01L 21/823864 |
| 2022/0336614 A1* | 10/2022 | Wang | H01L 29/66742 |

* cited by examiner

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly to a method of using etching process to trim spacers before forming epitaxial layer.

2. Description of the Prior Art

In order to increase the carrier mobility of semiconductor structure, it has been widely used to apply tensile stress or compressive stress to a gate channel. For instance, if a compressive stress were to be applied, it has been common in the conventional art to use selective epitaxial growth (SEG) technique to form epitaxial structure such as silicon germanium (SiGe) epitaxial layer in a silicon substrate. As the lattice constant of the SiGe epitaxial layer is greater than the lattice constant of the silicon substrate thereby producing stress to the channel region of PMOS transistor, the carrier mobility is increased in the channel region and speed of MOS transistor is improved accordingly. Conversely, silicon carbide (SiC) epitaxial layer could be formed in silicon substrate to produce tensile stress for gate channel of NMOS transistor.

Current approach of forming MOS transistor having epitaxial layer typically conducts a lightly doped ion implantation process to form lightly doped drains (LDDs) in the substrate adjacent to two sides of the spacer before forming epitaxial layers. However, lightly doped drains formed by ion implantation process is unable to accurately control the dopant distribution within the lightly doped drains thereby resulting in leakage and short channel effect (SCE). Hence, how to improve the current fabrication to resolve this issue has become an important task in this field.

SUMMARY OF THE INVENTION

According to an embodiment of the present invention, a method for fabricating semiconductor device includes the steps of first forming a gate structure on a substrate, forming a spacer adjacent to the gate structure, forming a recess adjacent to the spacer, trimming part of the spacer, and then forming an epitaxial layer in the recess. Preferably, the semiconductor device includes a first protrusion adjacent to one side of the epitaxial layer and a second protrusion adjacent to another side of the epitaxial layer, the first protrusion includes a V-shape under the spacer and an angle included by the V-shape is greater than 30 degrees and less than 90 degrees.

According to another aspect of the present invention, a semiconductor device includes a gate structure on a substrate, a spacer adjacent to the gate structure, and an epitaxial layer adjacent to the spacer. Preferably, the epitaxial layer comprises a protrusion having an angle greater than 30 degrees under the spacer.

According to yet another aspect of the present invention, a semiconductor device includes a gate structure on a substrate, a spacer adjacent to the gate structure, a first epitaxial layer adjacent to the spacer, a second epitaxial layer having a V-shape on the first epitaxial layer, and a third epitaxial layer on the second epitaxial layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
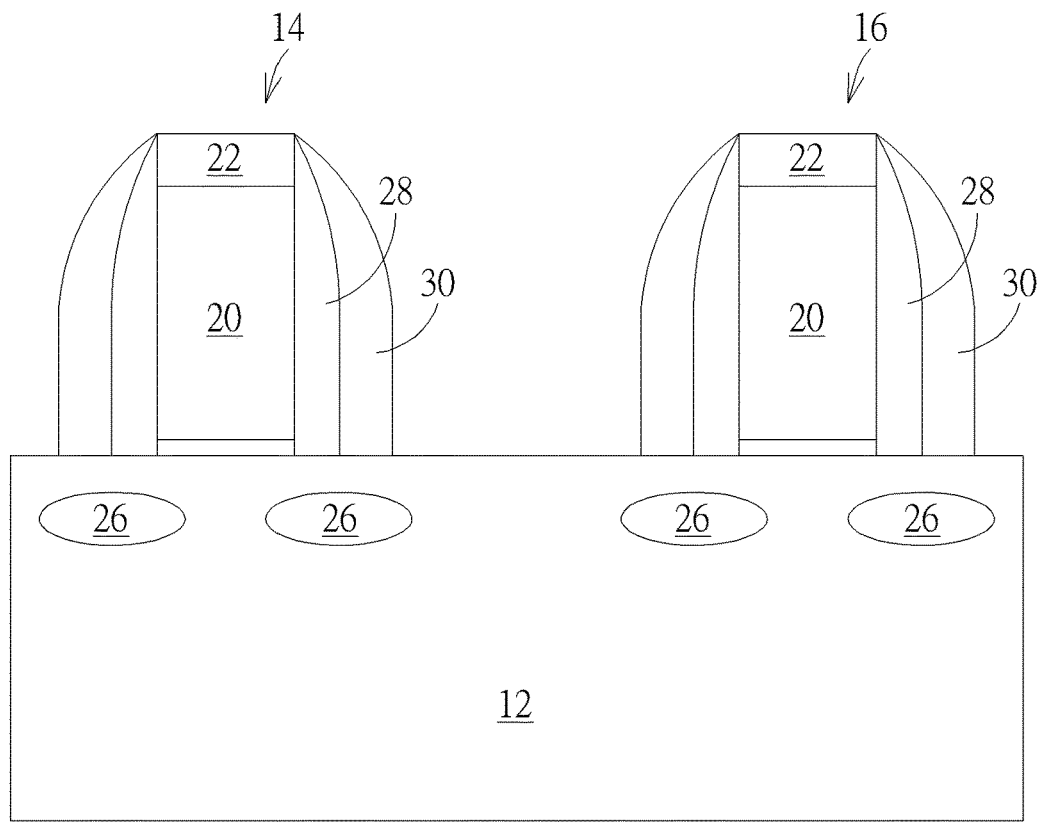
FIGS. 1-6 illustrate a method for fabricating a semiconductor device according to an embodiment of the present invention.

Referring to FIGS. 1-6, FIGS. 1-6 illustrate a method for fabricating a semiconductor device according to an embodiment of the present invention. As shown in FIG. 1, a substrate 12 is provided, and gate structures 14 and 16 are formed on the substrate 12. In this embodiment, the formation of the gate structures 14 and 16 could be accomplished by sequentially forming a gate dielectric layer, a gate material layer, and a hard mask on the substrate 12, conducting a pattern transfer process by using a patterned resist (not shown) as mask to remove part of the hard mask, part of the gate material layer, and part of the gate dielectric layer through single or multiple etching processes, and stripping the patterned resist. This forms gate structures 14 and 16 on the substrate 12, in which each of the gate structures 14 and 16 includes a patterned gate dielectric layer 18, patterned gate material layer 20, and patterned hard mask 22. It should be noted that to emphasize the formation of epitaxial layer between the two gate structures 14 and 16 in the later process, two transistors are presented in this embodiment and only part of the transistor elements including the region between two gate structures 14 and 16 are shown in the following figures.

In this embodiment, the substrate 12 could be a semiconductor substrate such as a silicon substrate, an epitaxial substrate, a silicon carbide (SiC) substrate, or a silicon-on-insulator (SOI) substrate, but not limited thereto. The gate dielectric layer 18 could include silicon oxide ($SiO_2$), silicon nitride (SiN), or high-k dielectric material; the gate material layer 20 could include metal, polysilicon, or silicide; the material of hard mask 22 could be selected from the group consisting of $SiO_2$, SiN, SiC, and SiON.

According to an embodiment of the present invention, a plurality of doped wells or shallow trench isolations (STIs) could be selectively formed in the substrate 12. Despite the present invention pertains to a planar MOS transistor, it would also be desirable to apply the process of the present invention to non-planar transistors, such as FinFET devices, and in such instance, the substrate 12 shown in FIG. 1 would be a fin-shaped structure formed atop a substrate 12.

Next, at least one spacer is formed on sidewalls of each of the gate structures 14 and 16, and an ion implantation process such as a tilted angle implantation process could be conducted to implant dopants into the substrate 12 adjacent to two sides of the gate structures 14, 16 for forming pocket regions 26. In this embodiment, the spacer formed on sidewalls of each of the gate structures 14, 16 is preferably a composite spacer further including a spacer 28 disposed or directly contacting sidewalls of the gate structures 14, 16 or gate electrodes and a spacer 30 disposed on sidewalls of the spacer 28, in which each of the inner spacer 28 and the outer spacer 30 includes an I-shape cross-section. In this embodiment, the inner spacer 28 and the outer spacer 30 could be made of same material or different materials as both the spacers 28, 30 could include silicon oxide ($SiO_2$), silicon nitride (SiN), silicon oxynitride (SiON), silicon carbon nitride (SiCN), or combination thereof. Preferably, the pocket regions 26 and the type of transistor device being fabricated include different conductive types. For instance, if a PMOS transistor were fabricated in this embodiment, the pocket regions 26 preferably include n-type dopants, but not limited thereto.

Figure 2:
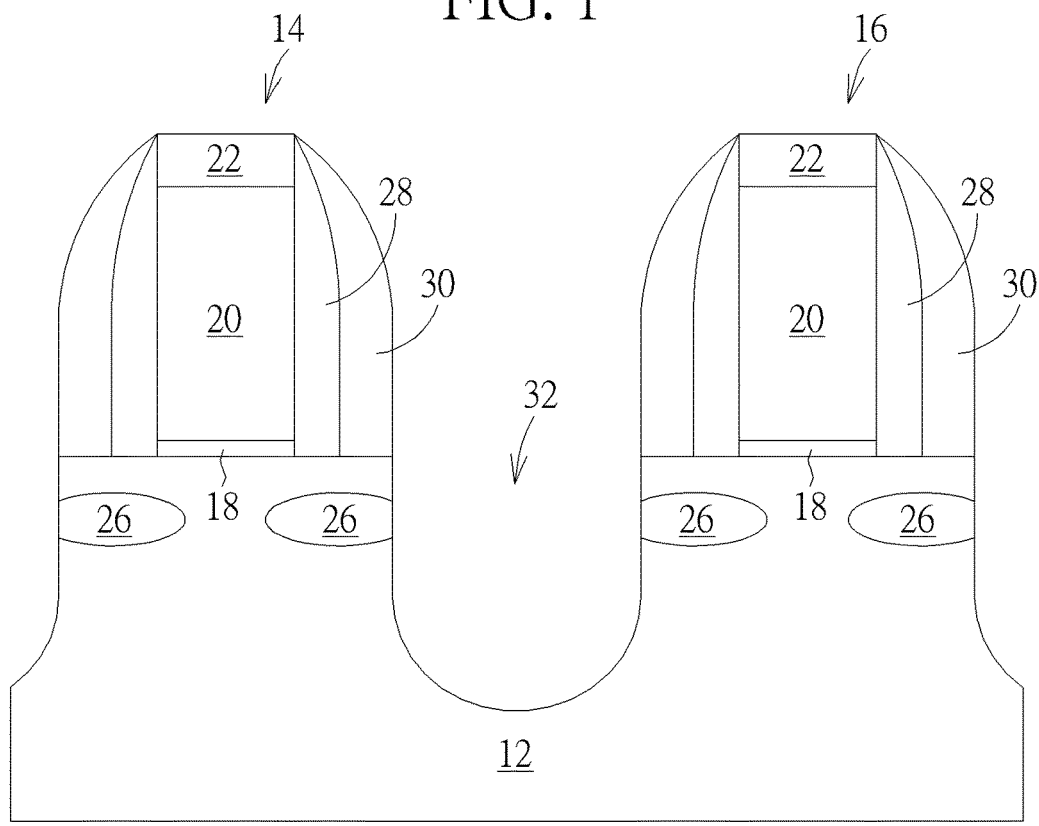

Next, as shown in FIG. 2, a first etching process is conducted to form initial recesses 32 in the substrate 12 adjacent to two sides of the spacer 30. In this embodiment, the first etching process preferably includes dry etching process and the first etching process could further includes three stage of etching processes, in which the first stage etching process includes a vertical direction etching process conducted to remove part of the substrate 12, the second stage etching process includes a horizontal direction etching process conducted to remove part of the substrate 12, and the third stage etching process includes another vertical direction etching process conducted to remove part of the substrate 12 for forming the recesses 32.

Specifically, the first stage etching process preferably includes hydrogen bromide (HBr) and/or helium (He), in which the flow of HBr and/or He is approximately 200/20 standard cubic centimeter per minute (sccm) and the duration of the process is approximately 11 seconds. The second stage etching process preferably includes chlorine gas ($Cl_2$) and/or ammonia ($NH_3$), in which the flow of $Cl_2$ and $NH_3$ is approximately 50/10 sccm while the duration of the process is approximately 15 seconds. The third stage etching process preferably includes hydrogen bromide (HBr) and/or helium (He), in which the flow of HBr and/or He is approximately 200/20 sccm and the duration of the process is approximately 6-10 seconds.

Figure 3:
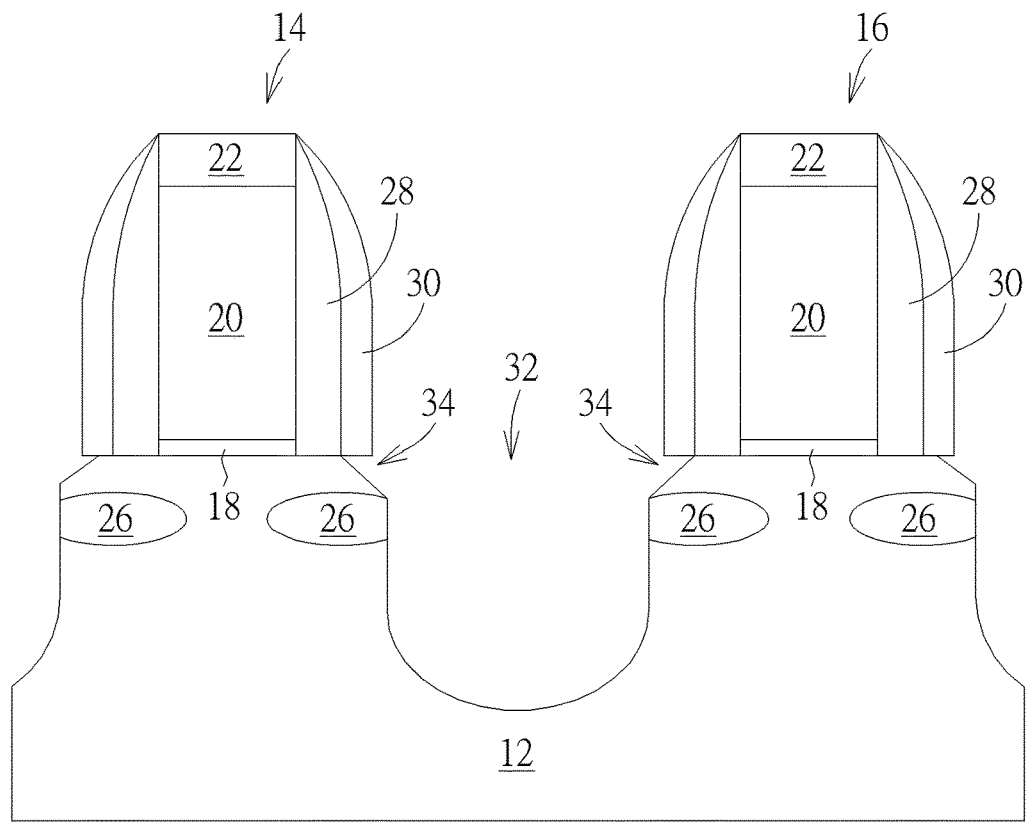

Next, as shown in FIG. 3, a second etching process is conducted to trim the spacer 30 for reducing the overall thickness or width of the spacer 30. In this embodiment, the second etching process preferably includes another dry etching process and gases used in the second etching process could include trifluoromethane ($CHF_3$), tetrafluoromethane ($CF_4$), or combination thereof, in which the flow of $CHF_3$ or $CF_4$ is approximately 35/60 sccm and duration of the etching process is about 0.05 ns. It should be noted that the etching gas used during the second etching process not only trims the spacer 30 but also removes part of the substrate 12 adjacent to two sides of the spacer 30 to form voids 34 or indentations directly under the spacer 30. Despite the width of the spacer 30 is slightly reduced during the second etching process, the bottom surface of the spacer 30 is still even with the surface of the substrate 12 so that the top surface of the voids 34 is also even with the surface of the substrate 12 directly under the gate structures 14, 16 or the bottom surface of the spacer 28. According to other embodiment of the present invention, the voids 34 could not only expose the bottom surface of the spacer 30 but could also be extended inward to expose the bottom surface of the spacer 28, which is also within the scope of the present invention.

Figure 4:
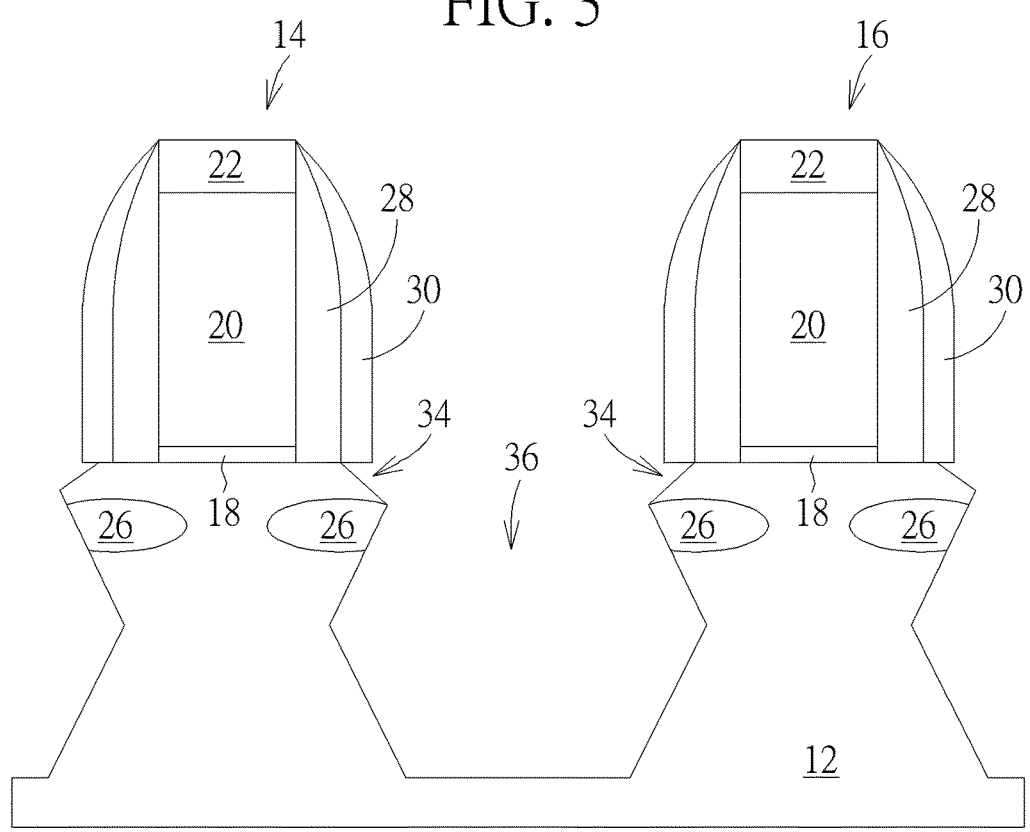

Next, as shown in FIG. 4, a third etching process is conducted to isotropically expand or enlarge the initial recesses 32 for forming recesses 36. In this embodiment, the third etching process preferably includes wet etching process, in which the wet etching process could be accomplished using etchant including but not limited to for example ammonium hydroxide ($NH_4OH$) or tetramethylammonium hydroxide (TMAH). It should be noted that the formation of the recesses 36 is not limited to wet etching process disclosed in this embodiment. Instead, the recesses 36 could also be formed by single or multiple dry etching and/or wet etching processes, which are all within the scope of the present invention. According to an embodiment of the present invention, each of the recesses 36 could have various cross-section shapes, including but not limited to for example a circle, a hexagon, or an octagon. Despite the cross-section of each of the recesses 36 in this embodiment pertains to be a hexagon, it would also be desirable to form the recesses 36 with aforementioned shapes, which are all within the scope of the present invention.

Figure 5:
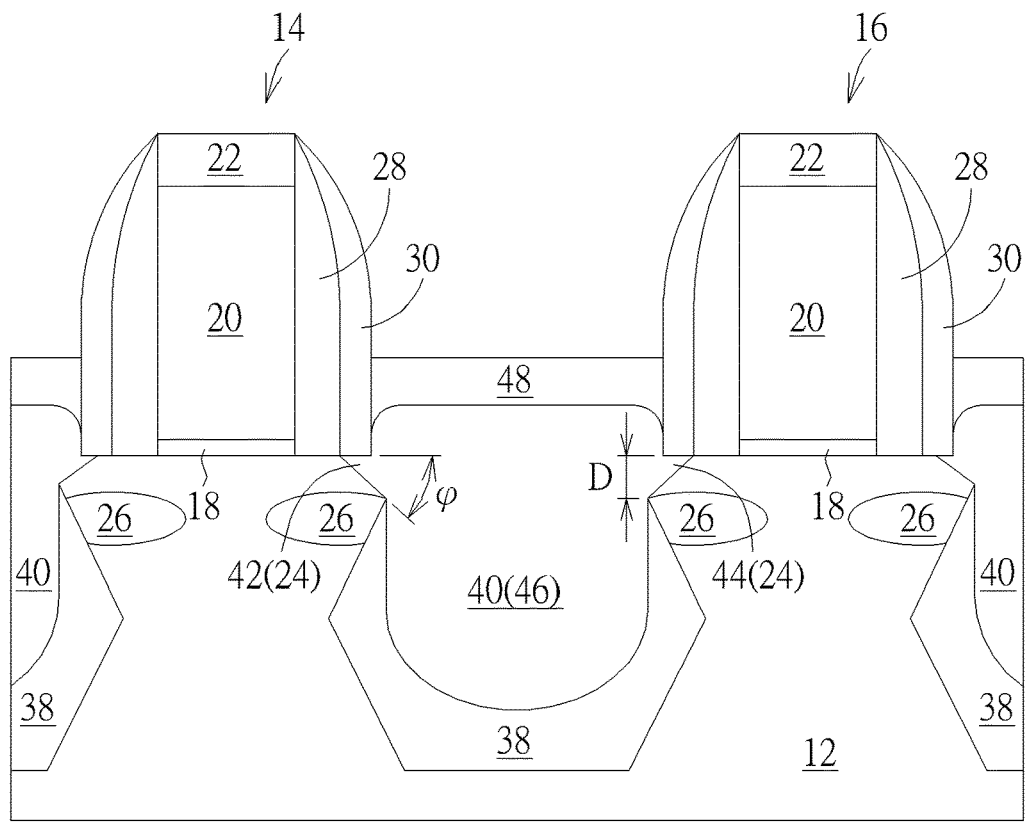

Next, as shown in FIG. 5, a selective epitaxial growth (SEG) process is conducted to form buffer layers 38 and epitaxial layers 40 in the recesses 36 while filling the voids 34 completely. In this embodiment, the combination of buffer layers 38 and epitaxial layers 40 preferably constitute a hexagon shaped cross-section and a top surface of the epitaxial layers 40 is slightly higher than a top surface of the substrate 12. Taking an epitaxial layer adjacent to one side of the gate structure such as the epitaxial layer 40 between the gate structures 14, 16 as an example, two protrusions including a first protrusion 42 and a second protrusion 44 are formed adjacent to two sides of the epitaxial layer 40 by filling the voids 34 with epitaxial layer 40 as the two protrusions 42, 44 contact the bottom surfaces of the spacers 30 directly. Preferably, each of the first protrusion 42 and the second protrusion 44 includes a V-shape directly under the spacer 30, the included angle φ of the V-shape is preferably greater than 30 degrees and less than 90 degrees, and the depth D of each of the first protrusion 42 and the second protrusions 44 is less than ⅕ of the entire depth of the epitaxial layer 40 including but not limited to for example 5 nm to 30 nm.

In this embodiment, the epitaxial layers 40 could also be formed to include different material depending on the type of transistor being fabricated. For instance, if the MOS transistor being fabricated were to be a PMOS transistor, the epitaxial layers 40 could be made of material including but not limited to for example SiGe, SiGeB, or SiGeSn. If the MOS transistor being fabricated were to be a NMOS transistor, the epitaxial layers 40 could be made of material including but not limited to for example SiC, SiCP, or SiP. Moreover, the SEG process could also be adjusted to form a single-layered epitaxial structure or multi-layered epitaxial structure, in which heteroatom such as germanium atom or carbon atom of the structure could be formed to have gradient while the surface of the epitaxial layers 40 is preferred to have less or no germanium atom at all to facilitate the formation of silicide afterwards. Since the present embodiment pertains to the fabrication of PMOS transistor, the germanium content within the epitaxial layers 40 is preferably between 30% to 50% while the concentration of boron in the epitaxial layers 40 is preferably between $1.0 \times 10^{20}$ atoms/$cm^3$ to $1.0 \times 10^{21}$ atoms/$cm^3$.

It should be noted that in contrast to using ion implantation approach for forming lightly doped drains (LDDs) in current process, the present invention preferably omits the process of conducting ion implantation process for forming LDDs but instead employs an in-situ doping approach to form doped regions with even concentration distribution during the formation of the epitaxial layers 40. Preferably, the doped regions formed in the first protrusion 42 and the second protrusions 44 are serving as lightly doped drains 24. After the LDDs 24 are formed, an ion implantation process could be conducted to implant dopants into substantially central region of the epitaxial layers 40 such as regions not directly under the spacer 30 and outside the first protrusion 42 and the second protrusion 44 for forming source/drain regions 46, in which the concentration of the source/drain regions 46 is greater than the concentration of the lightly doped drains 24 formed in the first protrusion 42 and second protrusion 44 while the two regions 24, 46 share dopants of same conductive type. Next, a cap layer 48 is formed on the epitaxial layers 40, in which the cap layer 48 made of pure silicon is preferably grown upward along the sidewalls of the spacer 30 and a top surface of the cap layer 48 preferably includes a planar surface.

Figure 6:
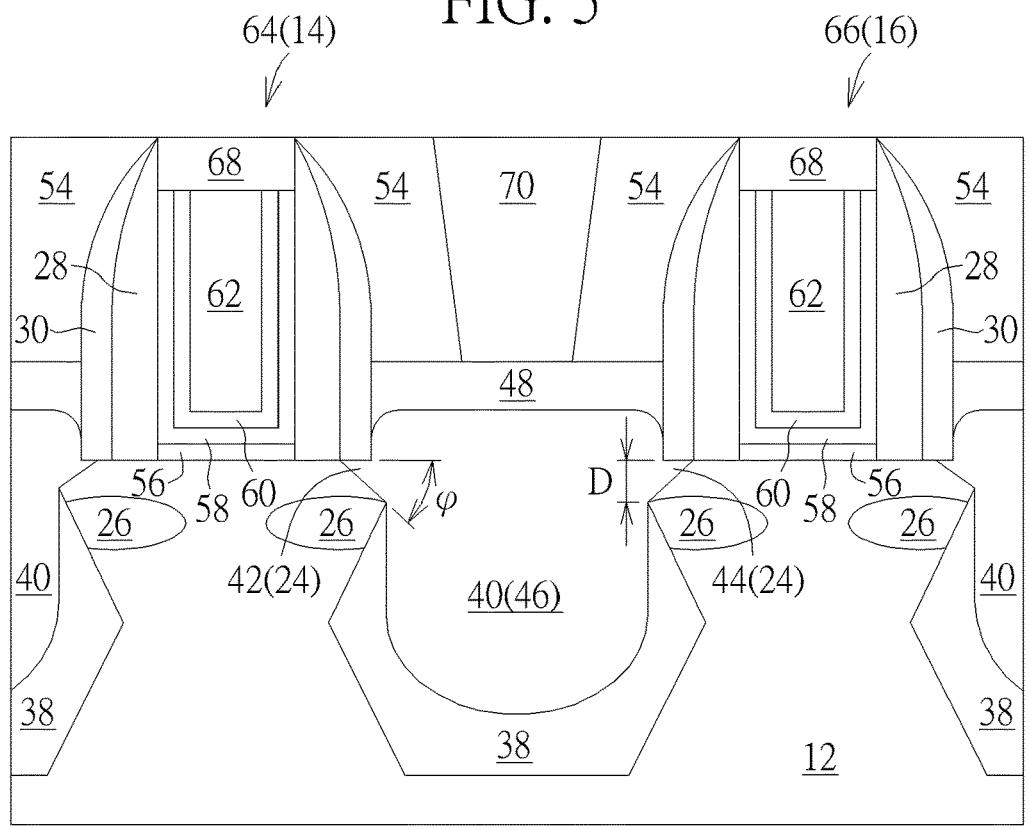

Next, as shown in FIG. 6, a contact etch stop layer (CESL) (not shown) and an interlayer dielectric (ILD) layer 54 are formed on the gate structure 14, 16, and a planarizing process such as chemical mechanical polishing (CMP) process is conducted to remove part of the ILD layer 54 and part of the CESL to expose hard masks 22 so that the top surfaces of the hard masks 22 and ILD layer 54 are coplanar.

Next, a replacement metal gate (RMG) process is conducted to transform the gate structures 14, 16 into metal gates. For instance, the RMG process could be accomplished by first performing a selective dry etching or wet etching process, such as using etchants including but not limited to for example ammonium hydroxide ($NH_4OH$) or tetramethylammonium hydroxide (TMAH) to remove the hard masks 22, gate material layer 20 and even gate dielectric layer 18 for forming recesses (not shown) in the ILD layer 54. Next, a selective interfacial layer 56 or gate dielectric layer, a high-k dielectric layer 58, a work function metal layer 60, and a low resistance metal layer 62 are formed in the recesses, and a planarizing process such as CMP is conducted to remove part of low resistance metal layer 62, part of work function metal layer 60, and part of high-k dielectric layer 58 to form gate structures 14, 16 made from metal gates 64, 66. In this embodiment, each of the gate structures 14, 16 or metal gates fabricated through high-k last process of a gate last process preferably includes an interfacial layer 56 or gate dielectric layer (not shown), a U-shaped high-k dielectric layer 58, a U-shaped work function metal layer 60, and a low resistance metal layer 62.

In this embodiment, the high-k dielectric layer 58 is preferably selected from dielectric materials having dielectric constant (k value) larger than 4. For instance, the high-k dielectric layer 58 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 60 is formed for tuning the work function of the metal gate in accordance with the conductivity of the device. For an NMOS transistor, the work function metal layer 60 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 60 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 60 and the low resistance metal layer 62, in which the material of the barrier layer may include titanium (Ti), titanium nitride (TiN), tantalum (Ta) or tantalum nitride (TaN). Furthermore, the material of the low-resistance metal layer 62 may include copper (Cu), aluminum (Al), titanium aluminum (TiAl), cobalt tungsten phosphide (CoWP) or any combination thereof.

Next, part of the high-k dielectric layer 58, part of the work function metal layer 60, and part of the low resistance metal layer 62 are removed to form recesses (not shown), hard masks 68 are then formed into the recesses, and a planarizing process is conducted so that the top surfaces of the hard masks 68 and ILD layer 54 are coplanar. The hard masks 68 could be made of material including but not limited to for example $SiO_2$, SiN, SiON, SiCN, or combination thereof.

Next, a contact plug formation could be conducted to form contact plugs 70 electrically connected to the source/drain regions 46. In this embodiment, the formation of contact plugs 70 could be accomplished by removing part of the ILD layer 54 and part of the CESL to form contact holes (not shown), and then depositing a barrier layer (not shown) and a metal layer (not shown) into the contact holes. A planarizing process, such as CMP is then conducted to remove part of the metal layer, part of the barrier layer, and even part of the ILD layer 54 to form contact plugs 70, in which the top surface of the contact plugs 70 is even with the top surface of the ILD layer 54. In this embodiment, the barrier layer is selected from the group consisting of Ti, Ta, TiN, TaN, and WN, and the metal layer is selected from the group consisting of Al, Ti, Ta, W, Nb, Mo, and Cu.

Referring again to FIG. 6, FIG. 6 further illustrates a structural view of a semiconductor device according to an embodiment of the present invention. As shown in FIG. 6, the semiconductor device preferably includes at least a gate structure 14 made of metal gate 64 disposed on the substrate 12, spacers 28, 30 disposed adjacent to the gate structure 14, pocket regions 26 disposed in the substrate 12 adjacent to two sides of the gate structure 14, and epitaxial layers 40 disposed in the substrate 12 adjacent to two sides of the spacers 30, in which each of the epitaxial layers 40 includes two protrusions and each of the protrusions includes an angle greater than 30 degrees directly under the spacer 30.

Specifically, the epitaxial layer adjacent to one side of the gate structure such as the epitaxial layer 40 between the gate structures 14, 16 includes a first protrusion 42 adjacent to one side of the epitaxial layer 40 and a second protrusion 44 adjacent to another side of the epitaxial layer 40, in which the first protrusion 42 is disposed in the substrate 12 adjacent to one side of the gate structure 14 from another perspective while the second protrusion 44 is disposed in the substrate 12 adjacent to one side of the gate structure 16. Viewing from a more detailed perspective, the first protrusion 42 directly contacts the bottommost surface of the spacer 30 adjacent to the gate structure 14, the second protrusion 44 directly contacts the bottommost surface of the spacer 30 adjacent to the gate structure 16, each of the first protrusion 42 and the second protrusion 44 includes a V-shape directly under the spacer 30, the included angle φ of the V-shape is preferably greater than 30 degrees and less than 90 degrees, and the depth D of each of the first protrusion 42 and the second protrusions 44 is less than 1/5 of the entire depth of the epitaxial layer 40 including but not limited to for example 5 nm to 30 nm.

Figure 7:
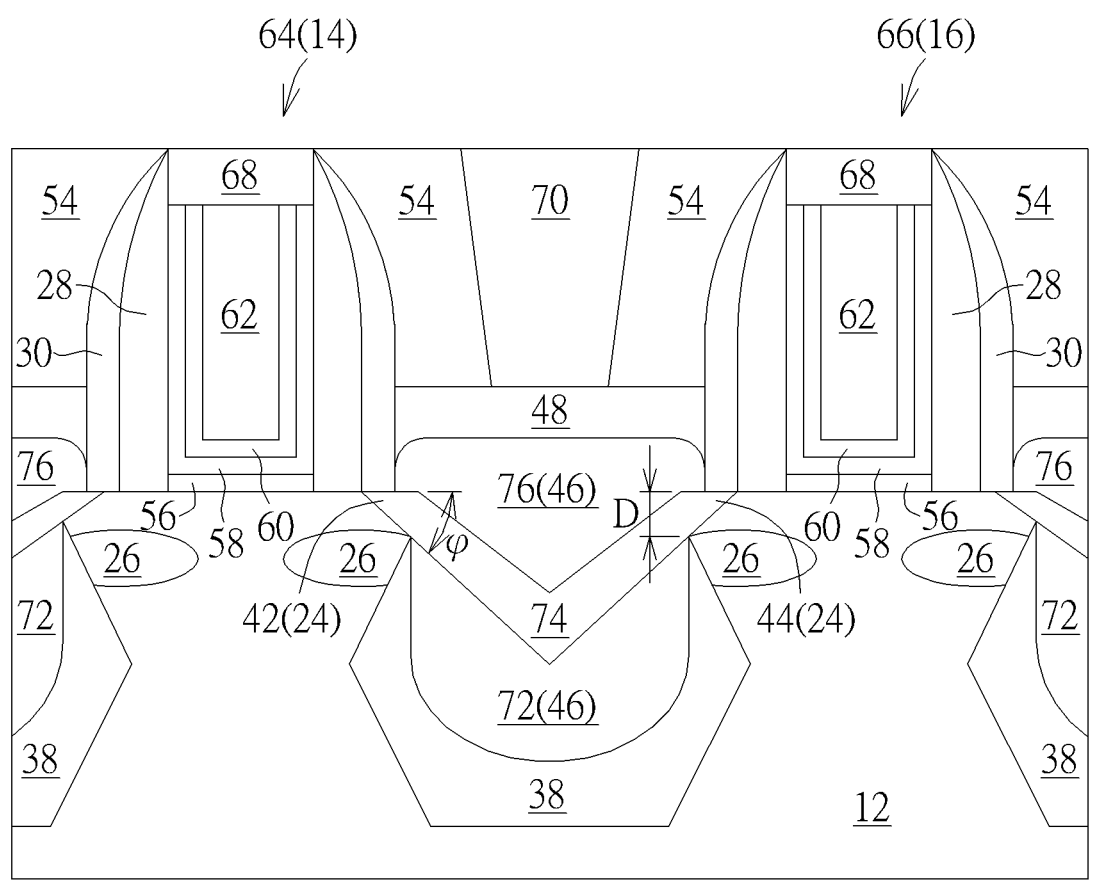
FIG. 7 illustrates a structural view of a semiconductor device according to an embodiment of the present invention.

Referring to FIG. 7, FIG. 7 illustrates a structural view of a semiconductor device according to an embodiment of the present invention. As shown in FIG. 7, it would be desirable to first form first epitaxial layers 72 in the recesses 32 filling or without filling the voids 34 after forming the buffer layer 38 shown in FIG. 5, conduct a fourth etching process by using hydrofluoric acid (HCl) to remove part of the first epitaxial layers 72, forms second epitaxial layers 74 having V-shape cross-section on the first epitaxial layers 72, forms third epitaxial layers 76 on the second epitaxial layers 74, and then forms the cap layer 48 on the third epitaxial layers 76.

It should be noted in order to improve current leakage of the device, it would be desirable to form the first epitaxial layers 72 with in-situ dopants for forming source/drain regions 46 in the first epitaxial layers 72 and the third epitaxial layers 76 and form the second epitaxial layers 74 having another in-situ dopants with opposite conductive type in the second epitaxial layers 74 for forming lightly doped drains 24. In this embodiment for fabricating PMOS transistor, the source/drain regions 46 in the first epitaxial layers 72 and the third epitaxial layers 76 preferably include p-type dopants while the lightly doped drains 24 in the second epitaxial layers 74 include n-type dopants.

Overall, the second epitaxial layers 74 includes a substantially V-shape cross-section and similar to the epitaxial layers 40 from the aforementioned embodiment, two protrusions including a first protrusion 42 and a second protrusion 44 serving as lightly doped drains 24 are formed adjacent to two sides of the second epitaxial layer 74 by filling the voids 34 with second epitaxial layers 74 as the two protrusions 42, 44 contact the bottom surfaces of the spacers 30 directly. Preferably, each of the first protrusion 42 and the second protrusion 44 includes a V-shape directly under the spacer 30, the included angle φ of the V-shape is preferably greater than 30 degrees and less than 90 degrees, and the depth D of each of the first protrusion 42 and the second protrusions 44 is less than ⅕ of the overall depth from the first epitaxial layers 72 to the third epitaxial layers 76 including but not limited to for example 5 nm to 30 nm. In this embodiment, the germanium content within the first epitaxial layers 72 and/or the third epitaxial layers 76 is preferably between 30% to 50% while the concentration of boron in the epitaxial layers 72 and 76 is preferably between $1.0 \times 10^{20}$ atoms/cm$^3$ to $1.0 \times 10^{21}$ atoms/cm$^3$. The germanium content within the second epitaxial layers 74 is preferably between 30% to 50% while the concentration of n-type dopants such as phosphorus in the epitaxial layers 74 is preferably between $1.0 \times 10^{16}$ atoms/cm$^3$ to $1.0 \times 10^{21}$ atoms/cm$^3$.

Typically, an extra lightly doped ion implantation process is conducted after using ion implantation process to form pocket regions 26 and before using the aforementioned first etching process to form recesses 32 in the substrate to form lightly doped drains in the substrate adjacent to two sides of the spacer. Since lightly doped drains formed by ion implantation process is unable to accurately control the concentration distribution of dopants within the lightly doped drains thereby resulting in leakage and short channel effect (SCE), the present invention preferably omits the process of conducting ion implantation process for forming LDDs but instead employs an in-situ doping approach to form lightly doped regions (such as the first protrusion 42 and second protrusion 44) with uniform concentration distribution during the formation of the epitaxial layers (such as the second epitaxial layer 74). Moreover, another embodiment of the present invention involves performing an etching process to trim or thin the outer spacer 30 so that the lightly doped drains form by in-situ doping and epitaxial layers could be formed closer to the gate structures thereby improving the performance of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a gate structure on a substrate;
   a first spacer adjacent to and directly contacting the gate structure and a second spacer adjacent to the first spacer;
   a first epitaxial layer adjacent to the second spacer;
   a second epitaxial layer on the first epitaxial layer and contacting a bottom surface of the second spacer directly, wherein a bottom surface of the second epitaxial layer comprises a first V-shape, a top surface of the second epitaxial layer comprises a second V-shape, and the top surface of the second epitaxial layer is even with a bottom surface of the first spacer; and
   a third epitaxial layer on the second epitaxial layer and contacting a sidewall of the second spacer directly.

2. The semiconductor device of claim 1, wherein the first epitaxial layer and second epitaxial layer comprise dopants of opposite conductive type.

3. The semiconductor device of claim 1, wherein the second epitaxial layer and third epitaxial layer comprise dopants of opposite conductive type.

4. The semiconductor device of claim 1, wherein the first V-shape is directly under the second spacer.

* * * * *